(12) United States Patent
Vrtis et al.

(10) Patent No.: US 10,249,489 B2
(45) Date of Patent: Apr. 2, 2019

(54) USE OF SILYL BRIDGED ALKYL COMPOUNDS FOR DENSE OSG FILMS

(71) Applicant: VERSUM MATERIALS US, LLC, Tempe, AZ (US)

(72) Inventors: Raymond Nicholas Vrtis, Carefree, AZ (US); Robert Gordon Ridgeway, Chandler, AZ (US); Jennifer Lynn Anne Achtyl, Chandler, AZ (US); William Robert Entley, Center Valley, PA (US); Dino Sinatore, Whitehall, PA (US); Kathleen Esther Theodorou, Bethlehem, PA (US); Andrew J. Adamczyk, Scottsdale, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/789,790

(22) Filed: Oct. 20, 2017

(65) Prior Publication Data

US 2018/0122632 A1    May 3, 2018

Related U.S. Application Data

(60) Provisional application No. 62/416,302, filed on Nov. 2, 2016.

(51) Int. Cl.
*H01L 21/02* (2006.01)
*C23C 16/40* (2006.01)
(Continued)

(52) U.S. Cl.
CPC ...... *H01L 21/02216* (2013.01); *C23C 16/401* (2013.01); *C23C 16/46* (2013.01);
(Continued)

(58) Field of Classification Search
CPC ......... H01L 21/02126; H01L 21/02131; H01L 21/02134; H01L 21/02137;
(Continued)

(56) References Cited

U.S. PATENT DOCUMENTS 6,583,048 B1   6/2003   Vincent
7,932,188 B2   4/2011   Lukas
(Continued)

OTHER PUBLICATIONS

Wang, et al., "Advanced Processing: CMP of CU/low-.kappa. and Cu/ultralow-k layers," Solid State Technology, Sep. 2001, pp. 1-4.
(Continued)

*Primary Examiner* — Stephen W Smoot
(74) *Attorney, Agent, or Firm* — Joseph D. Rossi; David K. Benson

(57) ABSTRACT

Low dielectric organosilicon films are deposited by a process comprising the steps of: providing a substrate within a vacuum chamber; introducing into the vacuum chamber a gaseous silicon containing precursor composition comprising at least one organosilicon precursor selected from the group consisting of Formula (I) and Formula (II):

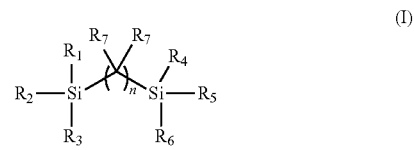

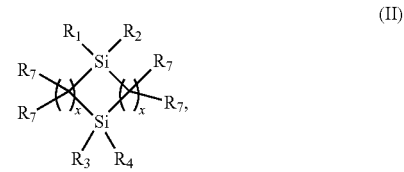

(Continued)

Predicted Bulk Modulus for various doped amorphous SiO₂ systems wherein, $R_1$, $R_2$, $R_3$, $R_4$, $R_5$, and $R_6$ are as defined herein, and applying energy to the gaseous structure forming composition in the vacuum chamber to induce reaction of the at least one organosilicon precursor to deposit a film on at least a portion of the substrate.

25 Claims, 1 Drawing Sheet

(51) Int. Cl.
- *C23C 16/46* (2006.01)
- *C23C 16/48* (2006.01)
- *C23C 16/50* (2006.01)
- *C23C 16/505* (2006.01)
- *C23C 16/56* (2006.01)

(52) U.S. Cl.
CPC ............... *C23C 16/48* (2013.01); *C23C 16/50* (2013.01); *C23C 16/505* (2013.01); *C23C 16/56* (2013.01); *H01L 21/0262* (2013.01); *H01L 21/02137* (2013.01); *H01L 21/02203* (2013.01); *H01L 21/02271* (2013.01); *H01L 21/02274* (2013.01); *H01L 21/02348* (2013.01)

(58) Field of Classification Search
CPC ......... H01L 21/02164; H01L 21/02167; H01L 21/02208; H01L 21/02211; H01L 21/02214; H01L 21/02216; H01L 21/02271; H01L 21/02274; H01L 21/02348; H01L 21/0262; C23C 16/401; C23C 16/402; C23C 16/56

See application file for complete search history.

(56) References Cited

U.S. PATENT DOCUMENTS

| | | | |
|---|---|---|---|
| 2003/0064154 A1* | 4/2003 | Laxman | C07F 7/0859 427/255.28 |
| 2007/0117408 A1 | 5/2007 | Nguyen et al. | |
| 2009/0181178 A1 | 6/2009 | Edelstein | |
| 2010/0061951 A1 | 3/2010 | Sujeeth et al. | |
| 2012/0178253 A1* | 7/2012 | Ahn | C23C 16/401 438/643 |
| 2013/0042790 A1* | 2/2013 | Dussarrat | C23C 16/30 106/287.14 |
| 2015/0087139 A1* | 3/2015 | O'Neill | C23C 16/24 438/482 |
| 2018/0105541 A1* | 4/2018 | Wang | C07F 7/10 |

OTHER PUBLICATIONS

Lin, et al., "Low-k Dielectrics Characterization for Damascene Integration," International Interconnect Technology Conference, Burlingame, Calif., Jun. 2001, pp. 146-148.

* cited by examiner

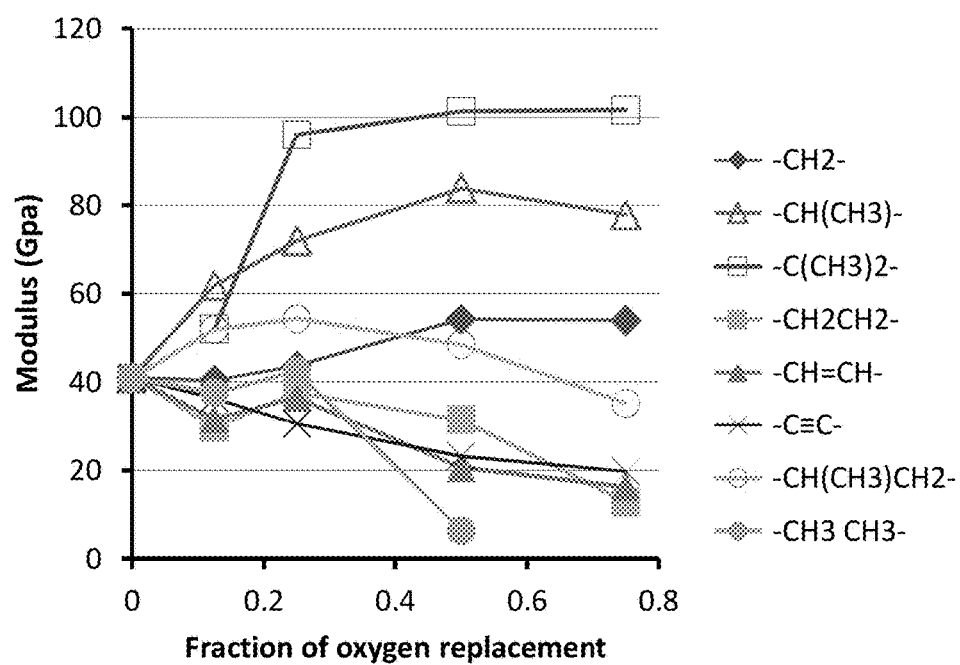
Predicted Bulk Modulus for various doped amorphous $SiO_2$ systems

USE OF SILYL BRIDGED ALKYL COMPOUNDS FOR DENSE OSG FILMS

CROSS-REFERENCE TO RELATED APPLICATIONS

This application claims priority under 35 U.S.C. § 119(e) to U.S. provisional patent application No. 62/416,302, filed on Nov. 2, 2016, the entirety of which is incorporated herein by reference.

BACKGROUND

The present invention relates generally to the formation of dielectric films. More specifically, the invention relates to dielectric materials and films comprising same having a low dielectric constant and enhanced mechanical properties and methods for making same.

All references, including publications, patent applications, and patents, cited herein are hereby incorporated by reference to the same extent as if each reference were individually and specifically indicated to be incorporated by reference and were set forth in its entirety herein.

There is a continuing desire in the microelectronics industry to increase the circuit density in multilevel integrated circuit devices such as memory and logic chips to improve the operating speed and reduce power consumption. In order to continue to reduce the size of devices on integrated circuits, the requirements for preventing capacitive crosstalk between the different levels of metallization becomes increasingly important. These requirements can be summarized by the expression "RC", whereby "R" is the resistance of the conductive line and "C" is the capacitance of the insulating dielectric interlayer. Capacitance "C" is inversely proportional to line spacing and proportional to the dielectric constant (k) of the interlayer dielectric (ILD). Such low dielectric materials are desirable for use, for example, as premetal dielectric layers or interlevel dielectric layers.

A number of processes have been used for preparing low dielectric constant films. Chemical vapor deposition (CVD) and spin-on dielectric (SOD) processes are typically used to prepare thin films of insulating layers. Other hybrid processes are also known such as CVD of liquid polymer precursors and transport polymerization CVD. A wide variety of low k materials deposited by these techniques have been generally classified in categories such as purely inorganic materials, ceramic materials, silica-based materials, purely organic materials, or inorganic-organic hybrids. Likewise, a variety of processes have been used for curing these materials to, for example, decompose and/or remove volatile components and substantially crosslink the films, such as heating, treating the materials with plasmas, electron beams, or UV radiation.

The industry has attempted to produce silica-based materials with lower dielectric constants by incorporating organics or other materials within the silicate lattice. Undoped silica glass ($SiO_2$), referred to herein as "USG," exhibits a dielectric constant of approximately 4.0. However, the dielectric constant of silica glass can be lowered to a value ranging from 2.7 to 3.5 by incorporating terminal groups such as fluorine or methyl into the silicate lattice. These materials are typically deposited as dense films and integrated within the IC device using process steps similar to those for forming USG films.

It is known that silicon dioxide ($SiO_2$) films have a hardness of ~7 GPa but also have a dielectric constant (k) of 3.8-4.2. The dielectric constant (k) of a material generally cannot be reduced without a subsequent reduction in the mechanical properties, i.e., elastic modulus (Young's modulus), hardness, toughness, of the material. Mechanical strength is needed for subsequent processing steps such as etching, CMP ("Chemical Mechanical Planarization"), and depositing additional layers such as diffusion barriers for copper, copper metal ("Cu"), and cap layers on the product. Mechanical integrity, or stiffness, compressive, and shear strengths, may be particularly important to survive CMP. It has been found that the ability to survive CMP may be correlated with the elastic modulus of the material, along with other factors including polishing parameters such as the down force and platen speed. See, for example, Wang et al., "Advanced processing: CMP of CU/low-.kappa. and Cu/ultralow-k layers," Solid State Technology, September, 2001; Lin et al., "Low-k Dielectrics Characterization for Damascene Integration," International Interconnect Technology Conference, Burlingame, Calif., June, 2001. These mechanical properties are also important in the packaging of the final product. Because of the trade-off in mechanical properties, it may be impractical to use certain porous low dielectric compositions.

There are known ways to improve the mechanical properties of as-deposited silicate films. For Example, U.S. Pat. No. 7,932,188 discloses a UV annealing step performed on a porous OSG wherein the film after exposure exihits an at least 10% improvement in its hardness and elastic modulus. Although it is known that OSG films can be deposited with dielectric constans in the range of 2.8 to 3.1, it has not been possible to deposit these films with hardnesses approaching 4.0 GPa, even after UV annealing. Accordingly, there is a need in the art for a class of OSG precursor compounds to form a dense OSG film that has a dielectric constant of 2.8 to 3.1 and which has an increased Hardness as measured in gigapascals (GPa).

SUMMARY

The compositions or formulations described herein and methods using same overcome the problems of the prior art by depositing a silicon-containing film on at least a portion of the substrate surface that provides desirable film properties.

In one aspect, the present development provides a process for depositing an organosilicate film on at least a part of a substrate, the process comprising the steps of: providing a substrate within a vacuum chamber; introducing into the vacuum chamber a gaseous silicon containing precursor composition comprising at least one organosilicon precursor selelcted from the group consisting of Formula (I) and Formula (II):

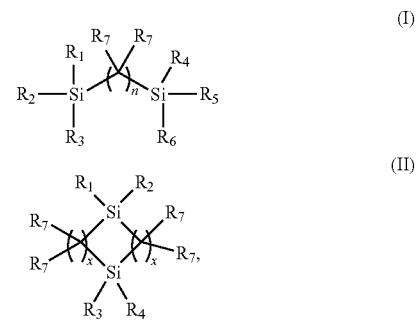

wherein, $R_1$, $R_2$, $R_3$, $R_4$, $R_5$, and $R_6$ are each independently selected from the group consisting of —$CH_3$ and —$OR_8$, wherein $R_8$ is a $C_1$-$C_4$ alkyl group; $R_7$ is H or —$CH_3$; x is 1 or 2; and n is 1, 2, 3, or 4, wherein at least one $R_7$ is —$CH_3$ when n is 1; and applying energy to the gaseous structure forming composition in the vacuum chamber to induce reaction of the at least one organosilicon precursor to deposit a film on at least a portion of the substrate.

BRIEF DESCRIPTION OF THE DRAWINGS

The present invention will hereinafter be described in conjunction with the appended figures wherein like numerals denote like elements:

FIG. 1 is a graph illustrating the molecular dynamic simulations for various precursors varying the fraction of Si—O—Si bridges by substitution with Si—CxHy-Si bridges and the impact on mechanical properties.

DETAILED DESCRIPTION

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

In one aspect, the present development provides a process for depositing an organosilicate film on at least a part of a substrate, the process comprising the steps of: providing a substrate within a vacuum chamber; introducing into the vacuum chamber a gaseous silicon containing composition comprising at least one organosilicon precursor selelcted from the group consisting of Formula (I) and Formula (II):

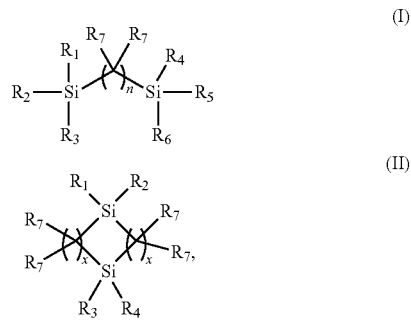

wherein, $R_1$, $R_2$, $R_3$, $R_4$, $R_5$, and $R_6$ are each independently selected from the group consisting of —$CH_3$ and —$OR_8$, wherein $R_8$ is a $C_1$-$C_4$ alkyl group; $R_7$ is H or —$CH_3$; x is 1 or 2; and n is 1, 2, 3, or 4, wherein at least one $R_7$ is —$CH_3$ when n is 1; and applying energy to the gaseous structure forming composition in the vacuum chamber to induce reaction of the at least one organosilicon precursor to deposit a film on at least a portion of the substrate.

Molecular simulations were used to assess the expected impact of bridging carbon (Si—$C_xH_y$—Si) on mechanical properties in dense silicon oxides. To assess the impact of a varying fraction of Si—O—Si bridges substituted with Si—$C_xH_y$—Si bridges, similar molecular dynamic simulations were performed with random replacement of O atoms with bridging carbon. FIG. 1 shows that for these MD simulations the bulk modulus increases significantly with Si—$CH(CH_3)$—Si and Si—$C(CH_3)_2$—Si bridges compared to the Si—$CH_2$—Si bridge and other the Si—$C_xH_y$—Si bridges studied. It is notable that the Si—$C(CH_3)_2$—Si bridge showed the highest bulk modulus increase as a function of fractional O replacement relative to the Si—$CH_2$—Si bridge. Furthermore, Si—O—Si bond cleavage to form terminal methyl groups (Si—$CH_3$ $CH_3$—Si) was also simulated, and these substitutions showed the strongest decrease in mechanical strength as a function of increased fractional replacement of Si—O—Si bridges.

From this modeling, without wanting to be bound by any particular theory, it is believed that the addition of methyl groups to the carbon chain connecting the two silicon atoms will remove degrees of freedom from the movement of the bridging carbons as the bridge will not be able to freely rotate or rock as easily. This removal of degrees of freedom is postulated to "lock" the bridge in place and increase the mechanical properties.

The organosilicate film depostied by the method of the present invention is selected from the group consisting of a carbon-doped silicon oxide film. The compositions can be pre-mixed compositions, pre-mixtures (mixed before being used in the deposition process), or in-situ mixtures (mixed during the deposition process). Thus, in this disclosure the terms "mixture", "formulation", and "composition" are interchangeable.

In the method of the present development, typically the first step is placing a substrate comprising at least one surface feature into a reactor which is at at a temperature of from about −20° C. to about 600° C. Suitable substrates include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("$SiO_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, antireflective coatings, photoresists, organic polymers, porous organic and inorganic materials, metals such as copper, cobalt, ruthenium, tungsten, rhodium, and aluminum, or diffusion barrier layers, e.g., TiN, Ti, Ti(C)N, TaN, Ta(C)N, Ta, W, WN, TiSiN, TaSiN, SiCN, TiSiCN, TaSiCN, or W(C)N. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

Examples of suitable deposition processes for the method disclosed herein include, but are not limited to, thermal chemical vapor deposition (CVD), Plasma enhanced CVD (PECVD), atomic layer deposition (ALD, or plasma enhanced cyclic CVD (PECCVD) process. In one embodiment, the films are deposited using a plasma-based (e.g., remote generated or in situ) CVD process. The term "reactor" as used herein, includes without limitation, a reaction chamber or deposition chamber.

In certain embodiments, the substrate may be exposed to one or more pre-deposition treatments such as, but not limited to, a plasma treatment, thermal treatment, chemical treatment, ultraviolet light exposure, electron beam exposure, and combinations thereof to affect one or more properties of the films. These pre-deposition treatments may occur under an atmosphere selected from inert, oxidizing, and/or reducing.

Although the chemical reagents used herein may be sometimes described as "gaseous," it is understood that the chemical reagents may be delivered directly as a gas to the reactor, delivered as vapors from vaporizing liquid or bubbling liquid using carrier gas such as nitrogen, helium or argon, vapors from subliming solid and/or transported by an inert carrier gas into the reactor.

In preferred embodiemnts, the orgamosilicate film deposited by present method is a dense organosilicate glass (OSG) film which has a dielectric constant of from about 2.8 to about 3.1, which has a Hardness of from about 3.2 to about 4.5 gigapascals (GPa) as measured using a MTS Nano Indenter. This is a significant decrease in dielectric constant over silicon dioxide films which typically have a dielectric constant of from about 3.8 to about 4.2 with a hardness of about 7 GPa.

The method of the present development includes the step of introducing into the vacuum chamber a gaseous structure forming composition comprising at least one organosilicon precursor selelcted from the group consisting of Formula (I) and Formula (II):

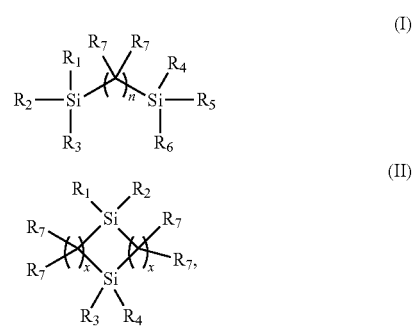

wherein, $R_1$, $R_2$, $R_3$, $R_4$, $R_5$, and $R_6$ are each independently selected from the group consisting of —$CH_3$ and —$OR_8$, wherein $R_8$ is a $C_1$-$C_4$ alkyl group; $R_7$ is H or —$CH_3$; x is 1 or 2; and n is 1, 2, 3, or 4, wherein at least one $R_7$ is —$CH_3$ when n is 1; and applying energy to the gaseous structure forming composition in the vacuum chamber to induce reaction of the at least one organosilicon precursor to deposit a film on at least a portion of the substrate.

In the formulae above and throughout the description, the term "alkyl" denotes either a linear or branched functional group having from 1 to 10, 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, isopropyl, isobutyl, sec-butyl, tert-butyl, iso-pentyl, tert-pentyl, cyclopentyl, isohexyl, cyclohexyl, and neohexyl. In certain embodiments, the alkyl group may have one or more substituted functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated. As used herein, the term "substituted" refers to e one or more atoms or group of atoms substituted in place of, for example, a hydrogen atom.

In certain embodiments, any one or more of substituents $R_1$, $R_2$, $R_3$, $R_4$, $R_5$, and $R_6$ in the formulae described above can be linked with a C—C bond in the above formula to form a ring structure when they are not hydrogen. As the skilled person will understand, the substituent may be selected from a linear or branched $C_1$ to $C_{10}$ alkylene moiety; a $C_2$ to $C_{12}$ alkenylene moiety; a $C_2$ to $C_{12}$ alkynylene moiety; a $C_4$ to $C_{10}$ cyclic alkyl moiety; and a $C_6$ to $C_{10}$ arylene moiety. In these embodiments, the ring structure can be unsaturated such as, for example, a cyclic alkyl ring, or saturated, for example, an aryl ring. Further, in these embodiments, the ring structure can also be substituted or substituted. In other embodiments, any one or more of substituents $R_1$, $R_2$, $R_3$, $R_4$, $R_5$, and $R_6$ are not linked.

Examples of compounds of Formula I include 1,1,1,3,3-pentamethoxy-2-methyl-1,3-disilabutane (PMOM-DSB)

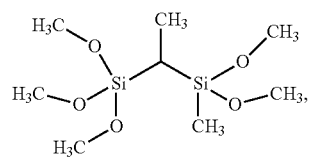

1,2-bis(methyldimethoxysilyl)ethane, 1,2-bis(tri methoxysilyl)ethane, 1,2-bis(dimethoxysilyl)ethane, 1,1-bis (trimethoxysilyl)ethane, 1,1-bis(methyldimethoxysilyl)ethane, 1,1-bis(dimethoxysilyl)ethane, dimethylbis(trimethoxysilyl)methane, dimethylbis(methyldimethoxysilyl)methane, dimethylbis(dimethoxysilyl)methane, 1,1,1,3,3-pentaethoxy-2-methyl-1,3-disilabutane, 1,2-bis(methyldiethoxysilyl)ethane, 1,2-bis(triethoxysilyl)ethane, 1,2-bis(diethoxysilyl)ethane, 1,1-bis(triethoxysilyl)ethane, 1,1-bis(methyldiethoxysilyl)ethane, 1,1-bis(diethoxysilyl)ethane, dimethylbis(triethoxysilyl)methane, dimethylis(methyldiethoxysilyl)methane, and dimethylbis(diethoxysilyl)methane.

Examples of compounds of Formula 2 include; 1,1,3,3-tetramethoxy-1,3-disilacyclobutane, 1,3-dimethoxy-1,3-dimethyl-1,3-disilacyclobutane, 1,3-dimethoxy-1,3-disilacyclobutane, 1,3,3-trimethoxy-1-methyl-1,3-disilacyclobutane, 1,3-dimethoxy-1-methyl-disilacyclobutane, 1,1-dimethoxy-1,3-disilacyclobutane, 1,1,4,4-tetramethoxy-1,4-disilacyclohexane, 1,4-dimethoxy-1,4-dimethyl-1,4-disilacyclohexane, 1,4-dimethoxy-1,4-disilacyclohexane, 1,4,4-trimethoxy-1-methyl-1,4-disilacyclohexane, 1,4-dimethoxy-1-methyl-disilacyclohexane, 1,1-dimethoxy-1,4-disilacyclohexane, 1,1,3,3-tetraethoxy-1,3-disilacyclobutane, 1,3-diethoxy-1,3-dimethyl-1,3-disilacyclobutane, 1,3-diethoxy-1,3-disilacyclobutane, 1,3,3-triethoxy-1-methyl-1,3-disilacyclobutane, 1,3-diethoxy-1-methyl-disilacyclobutane, 1,1-diethoxy-1,3-disilacyclobutane, 1,1,4,4-tetraethoxy-1,4-disilacyclohexane, 1,4-diethoxy-1,4-dimethyl-1,4-disilacyclohexane, 1,4-diethoxy-1,4-disilacyclohexane, 1,4,4-triethoxy-1-methyl-1,4-disilacyclohexane, 1,4-diethoxy-1-methyl-disilacyclohexane, and 1,1-diethoxy-1,4-disilacyclohexane.

In certain embodiments, mixtures of different organosilicon precursors are used in combination.

The organosilicon precursor compounds described herein may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The organosilicon precursor compounds are preferably substantially free of halide ions such as chloride or metal ions such as Al. As used herein, the term "substantially free" as it relates to halide ions (or halides) such as, for example, chlorides and fluorides, bromides, iodides, $Al^{3+}$ ions, $Fe^{2+}$, $Fe^{3+}$, $Ni^{2+}$, $Cr^{3+}$ means less than 5 ppm (by weight), preferably less than 3 ppm, and more preferably less than 1 ppm, and most preferably 0 ppm. As used herein, the term "free of" as it relates to such halide ions means 0 ppm. Chlorides or metal ions are known to act as decomposition catalysts for silicon precursors. Significant levels of chloride in the final product can cause the organosilicon precursors to degrade. The gradual degradation of the organosilicon precursors may directly impact the film deposition process making it difficult for the semiconductor manufacturer to meet film specifications. In addition, the shelf-life or stability is negatively impacted by the higher degradation rate of the organosilicon precursors thereby making it difficult to guarantee a 1-2 year shelf-life. Moreover, organosilicon precursors are known to form flammable and/or pyrophoric gases upon decomposition such as hydrogen and silane. Therefore, the accelerated decomposition of the organosilicon precursors presents safety and performance concerns related to the formation of these flammable and/or pyrophoric gaseous byproducts.

Organosilicon precursors according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodislanes, bromodisilanes, or iodorodislanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO-Al_2O_3$ blends can be used to remove halides such as chloride.

For those embodiments relating to a composition comprising a solvent(s) and at least one organosilicon precursor compound described herein, the solvent or mixture thereof selected does not react with the organosilicon compound. The amount of solvent by weight percentage in the composition ranges from 0.5% by weight to 99.5% or from 10% by weight to 75%. In this or other embodiments, the solvent has a boiling point (b.p.) similar to the b.p. of the precursors of Formulae I and II or the difference between the b.p. of the solvent and the b.p. of the organosilicon precursor precursors of Formulae I and II is 40° C. or less, 30° C. or less, or 20° C. or less, 10° C. or less, or 5° C. or less. Alternatively, the difference between the boiling points ranges from any one or more of the following end-points: 0, 10, 20, 30, or 40° C. Examples of suitable ranges of b.p. difference include without limitation, 0° C. to 40° C., 20° C. to 30° C., or 10° C. to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

In one particular embodiment, the introducing step, wherein the at least one organosilicon precursor compound is introduced into the reactor, is conducted at one or more temperatures ranging from −20° C. to 1000° C., or from about 400° C. to about 1000° C., or from about 400° C. to about 600° C., or from about −20° C. to about 400° C. In these or other embodiments, the substrate comprises a semiconductor substrate comprising a surface feature.

An oxidant, such as oxygen ($O_2$), ozone ($O_3$), nitrous oxide ($N_2O$), nitric oxide (NO), nitrogen dioxide ($NO_2$), dinitrogen tetroxide ($N_2O_4$) andlor hydrogen peroxide ($H_2O_2$), can optionally be added, but may not be necessary if the organosilicon precursor contains oxygen and SiO bonds.

One or more fluorine-providing gases may be used as an additive in the reaction or in a post-treatment. Examples of fluorine-providing gases are $NF_3$, $F_2$, $CF_4$3 $C_2F_6$, $C_4F_6$, and $C_6F_6$.

In addition to the organosilicon precursors, and optionally the oxygen-providing gas and the fluorine-providing gas, additional materials can be charged into the vacuum chamber prior to, during and/or after the deposition reaction. Such materials include reactive substances, such as gaseous or liquid organic substances, $NH_3$, $H_2$, $CO_2$, CO, or fluorocarbons. Examples of organic substances are $CH_4$, $C_2H_6$, $C_2H_4$, $C_2H_2$, $C_3H_8$, cyclopentane, cyclooctane, allene, propylene, alpha-terpinene, para-cymene, benzene, naphthalene, toluene and styrene.

The reagents (i.e., organosilicon precursors, oxidant, etc.) can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

In certain embodiments, mixtures of different organosilicon precursors such as, for example, at least one of Formula I and at least one of Formula II used in combination.

Energy is applied to the gaseous reagents to induce the gases to react and to form the film on at least a part of the substrate. Such energy can be provided by, e.g., thermal, plasma, pulsed plasma, helicon plasma, high density plasma, inductively coupled plasma, and remote plasma methods. A secondary rf frequency source can be used to modify the plasma characteristics at the substrate surface. Preferably, the film is formed by plasma enhanced chemical vapor deposition. It is particularly preferred to generate a capacitively coupled plasma at a frequency of 13.56 MHz. Plasma power is preferably from 0.02 to 7 watts/cm$^2$, more preferably 0.3 to 3 watts/cm$^2$, based upon a surface area of the substrate. It may be advantageous to employ a carrier gas which possesses a low ionization energy to lower the electron temperature in the plasma which in turn will cause less fragmentation in the OSG precursor and porogen. Examples of this type of low ionization gas include $CO_2$, $NH_3$, CO, $CH_4$, Ar, Xe, and Kr.

In some embodiments where the energy is plasma energy, the plasma source is selected from but not limited to the group consisting of a carbon source plasma, including a hydrocarbon plasma, a plasma comprising hydrocarbon and helium, a plasma comprising hydrocarbon and argon, carbon dioxide plasma, carbon monoxide plasma, a plasma comprising hydrocarbon and hydrogen, a plasma comprising hydrocarbon and a nitrogen source, a plasma comprising hydrocarbon and an oxygen source, and mixture thereof.

The flow rate for each of the gaseous reagents preferably ranges from 10 to 5000 sccm, more preferably from 30 to 1000 sccm, per single 200 mm wafer. The individual rates are selected so as to provide the desired amounts of structure-former and pore-former in the film. The actual flow rates needed may depend upon wafer size and chamber configuration, and are in no way limited to 200 mm wafers or single wafer chambers.

In some embodiments, the film is deposited at a rate of 50-250 nm/min.

The pressure in the vacuum chamber during deposition is preferably 0.01 to 600 torr, more preferably 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

Without intending to be bound by any particular theory, it is suspected that by using disiloxane precursors such as those of Formula I and Formula II, which have methylene or ethylene bridges, bridging Si—O—Si groups can be replaced with carbon bridges which will decrease the dielectric constant of a pure $SiO_2$ network while retaining the hardness.

In-situ or post-deposition treatments may be used to enhance materials properties like hardness, stability (to shrinkage, to air exposure, to etching, to wet etching, etc.), integrity, uniformity and adhesion. Such treatments can be applied to the film prior to, during and/or after porogen removal using the same or different means used for porogen removal. Thus, the term "post-treating" as used herein denotes treating the film with energy (e.g., thermal, plasma, photon, electron, microwave, etc.) or chemicals to remove porogens and, optionally, to enhance materials properties.

The conditions under which post-treating are conducted can vary greatly. For example, post-treating can be conducted under high pressure or under a vacuum ambient.

Thermal annealing is conducted under the following conditions. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal annealing as well as any other post-treating means. The temperature is preferably 200-500° C., and the temperature ramp rate is from 0.1 to 100 deg °C./min. The total annealing time is preferably from 0.01 min to 12 hours.

Chemical treatment of the OSG film ican also be conducted via use of fluorinating (HF, $SIF_4$, $NF_3$, $F_2$, $COF_2$, $CO_2F_2$, etc.), oxidizing ($H_2O_2$, $C_3$, etc.), chemical drying, methylating, or other chemical treatments that enhance the properties of the final material. Chemicals used in such treatments can be in solid, liquid, gaseous and/or supercritical fluid states.

In certain embodiments, the OSG film is subjected to annealing, preferably by by heat, or radiation (i.e., photoannealing). In these embodiments, photoanealing is conducted under the following conditions. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, ammonia etc.). The power may range from 0 to 5000 W. The wavelength is preferably IR, visible, UV or deep UV (wavelengths <200 nm). The temperature may range from ambient to 500° C. The pressure may range from 10 mtorr to atmospheric pressure. The total curing time is may range from 0.01 min to 12 hours.

Plasma treating for chemical modification of the OSG film is conducted under the following conditions. The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), amonia etc.). The plasma power is preferably 0-5000 W. The temperature is preferably ambient to 500° C. The pressure is preferably 10 mtorr to atmospheric pressure. The total curing time is preferably 0.01 min to 12 hours.

Microwave post- is conducted under the following conditions. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post is conducted under the following conditions. The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, June 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties through bond-formation processes in matrix.

The invention will be illustrated in more detail with reference to the following Examples, but it should be understood that the present invention is not deemed to be limited thereto.

EXAMPLES

Dense OSG Deposition from OSG Precursors—General Procedures

Exemplary films were formed via a plasma enhanced CVD process using an Applied Materials Precision-5000 system in a 200 mm D×Z vacuum chamber that was fitted with an Advance Energy 200 rf generator from a variety of different chemical precursors and process conditions. The CVD process generally involved the following basic steps: initial set-up and stabilization of gas flows, deposition, and purge/evacuation of chamber prior to wafer removal. UV annealing was performed using a Fusion UV system with a broad band UV bulb, with the wafer held under a helium gas flow at <10 torr pressure and at a temperature <400 C.

Thickness and refractive index were measured on an SCI Filmtek 2000 Reflectometer. Dielectric constants were determined using Hg probe technique on mid-resistivity p-type wafers (range 8-12 ohm-cm). FTIR spectra were measured using a Nicholet Nexxus 470 FTIR spectrometer. Mechanical properties were determined using MTS Nano Indenter. Compositional data were obtained by x-ray photoelectron spectroscopy (XPS) on a Physical Electronics 5000LS. The atomic % values reported in the tables do not include hydrogen.

Comparative Example 1

Deposition of Dense OSG Films from BDMMSM

An OSG film was deposited using the following recipe: 1000 mg/min 1,2-bis(dimethoxymethylsilyl)methane was delivered to the chamber via DLI, 200 sccm He carrier gas flow, 20 sccm O2 flow, 350 milli-inch showerhead/wafer spacing 350° C. wafer chuck temperature, 7 Torr chamber pressure to which a 800 W plasma was applied. The resulting dense OSG film was then UV annealed for 4 minutes to mechanically enhance the film. The resulting film had the following properties: dielectric constant at 1 MHz was 3.09, Modulus 23.6 GPa, Hardness 3.93 GPa, the refractive index at 632 nm was 1.476, the elemental composition as measured by XPS was 23.0% C, 43.7% O, 33.3% Si.

Example 1

Deposition of Dense OSG Films from PMOM-DSP

An OSG film was deposited using the following recipe: 1200 mg/min 1,1,1,3,3-pentamethoxy-3-methyl-1,3,disilapentane (PMOM-DSP) was delivered to the chamber via DLI, 200 sccm He carrier gas flow, 20 sccm O2 flow, 350 milli-inch showerhead/wafer spacing 400° C. wafer chuck temperature, 7 Torr chamber pressure to which a 600 W plasma was applied. The resulting dense OSG film was then UV annealed for 4 minutes to mechanically enhance the film. The resulting film had the following properties: dielectric constant at 1 MHz was 3.23, Modulus 24.9 GPa, Hardness 4.13 GPa, the refractive index at 632 nm was 1.451, the elemental composition as measured by XPS was 17.6% C 48.4%O 34.2%Si.

Example 2

Deposition of Dense OSG Films from 1,2-bis(methyldimethoxysilyl)ethane (BDMMSE)

An OSG film was deposited using the following recipe: 800 mg/min 1,2-bis(dimethoxymethylsilyl)ethane (BDMMSE) was delivered to the chamber via DLI, 200 sccm He carrier gas flow, 100 sccm O2 flow, 350 milli-inch showerhead/wafer spacing 325° C. wafer chuck temperature, 7 Torr chamber pressure to which a 600 W plasma was applied. The resulting dense OSG film was then UV annealed for 4 minutes to mechanically enhance the film. The resulting film had the following properties: dielectric constant at 1 MHz was 3.15, Modulus 27.7 GPa, Hardness 4.62 GPa, the refractive index at 632 nm was 1.430.

Molecular simulations were used to assess the expected impact of bridging carbon (Si—$C_xH_y$—Si) on mechanical properties in dense silicon oxides. Classical molecular dynamics (MD) simulations with periodic boundary conditions were performed using the Forcite module in the BioVia Materials Studio 7.0 software. Using the COMPASS force field, a periodic unit cell comprised of 306 Si atoms and 612 O atoms was created from an experimental a-quartz x-ray crystal structure (cr-$SiO_2$). Bonds were removed from this crystalline structure and the system was then annealed in a series of constant temperature, pressure, and number of atoms MD simulations using an NPT ensemble to create an amorphous $SiO_2$ matrix (a-$SiO_2$). Bonds were added back to the a-$SiO_2$ matrix and MD simulations were used to calculate equilibrated density. The equilibrated a-$SiO_2$ unit cell was then compressed at different isotropic pressures using MD simulations. The bulk modulus was regressed using the third-order Birch-Murnaghan equation of state and the MD simulation results of volume as a function of pressure for the a-$SiO_2$ matrix.

To assess the impact of a varying fraction of Si—O—Si bridges substituted with Si—$C_xH_y$—Si bridges, similar MD simulations were performed with random replacement of O atoms with bridging carbon. FIG. 1 shows that for these MD simulations the bulk modulus increases significantly with Si—$CH(CH_3)$—Si and Si—$C(CH_3)_2$—Si bridges compared to the Si—$CH_2$—Si bridge and other the Si—$C_xH_y$—Si bridges studied. It is notable that the Si—$C(CH_3)_2$—Si bridge showed the highest bulk modulus increase as a function of fractional O replacement relative to the Si—$CH_2$—Si bridge. Furthermore, Si—O—Si bond cleavage to form terminal methyl groups (Si—$CH_3$ $CH_3$—Si) was also simulated, and these substitutions showed the strongest decrease in mechanical strength as a function of increased fractional replacement of Si—O—Si bridges.

Although the principles of the invention have been described above in connection with preferred embodiments, it is to be clearly understood that this description is made only by way of example and not as a limitation of the scope of the invention.

The invention claimed is:
1. A chemical vapor deposition method for depositing an organosilicate film on at least a part of a substrate, the process comprising the steps of:
providing a substrate within a vacuum chamber;
introducing into the vacuum chamber a gaseous structure forming composition comprising at least one organosilicon precursor selected from the group consisting of Formula (I) and Formula (II):

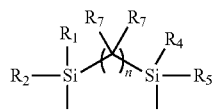

(I)

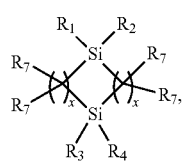

(II)

wherein,
$R_1$, $R_2$, $R_3$, $R_4$, $R_5$, and $R_6$ are each independently selected from the group consisting of —$CH_3$ and —$OR_8$, wherein $R_8$ is a $C_1$-$C_4$ alkyl group;
$R_7$ is H or —$CH_3$;
x is 1 or 2; and
n is 1, 2, 3, or 4, wherein at least one $R_7$ is —$CH_3$ when n is 1;
applying energy to the gaseous structure forming composition in the vacuum chamber to induce reaction of the at least one organosilicon precursor to deposit a film on at least a portion of the substrate.

2. The chemical vapor deposition method of claim 1 wherein the film has a dielectric constant between 2.8 and 3.5.

3. The method of claim 2 wherein the film has a Young's modulus greater than 20 GPa and/or a nanoindentation hardness greater than 3.5 GPa.

4. The chemical vapor deposition method of claim 1 wherein the energy is plasma energy.

5. The chemical vapor deposition method of claim 1 further comprising the step of subjecting the film to a post treatment comprising UV radiation.

6. The chemical vapor deposition method of claim 5 wherein the film has a dielectric constant between 2.8 and 3.5.

7. The chemical vapor deposition method of claim 5 where the UV treatment is carried out at elevated temperatures preferably 200-500° C.

8. The chemical vapor deposition method of claim 5 where the UV treatment is carried out in a reactive environment comprising at least one selected from the group consisting of $O_2$, $H_2$, and $NH_3$.

9. The method of claim 5 wherein the film has a Young's modulus greater than 20 GPa and/or a nanoindentation hardness greater than 3.5 GPa.

10. The chemical vapor deposition method of claim 1 further comprising the step of subjecting the film to a post treatment comprising heat.

11. The chemical vapor deposition method of claim 1 wherein the at least one organosilicon precursor is a precursor of Formula (I).

12. The chemical vapor deposition method of claim 11 wherein the at least one organosilicon precursor is at least one precursor selected from the group consisting of 1,1,1,3,3-pentamethoxy-2-methyl-1,3-disilabutane (PMOMDSB), 1,2-bis(methyldimethoxysilyl)ethane,1,2-bis(trimethoxysilyl)ethane, 1,2-bis(dimethoxysilyl)ethane, 1,1-bis(trimethoxysilyl)ethane, 1,1-bis(methyldimethoxysilyl) ethane, 1,1-bis(dimethoxysilyl)ethane, 1,1-dimethyl-1,1-bis(trimethoxysilyl)methane, 1,1-dimethyl-1,1-bis(methyldimethoxysilyl)methane, 1,1-dimethyl-1,1-bis(dimethoxysilyl)methane, 1,1,1,3,3-pentaethoxy-2-methyl-1,3-disilabutane, 1,2-bis(methyldiethoxysilyl)ethane, 1,2-bis(triethoxysilyl)ethane, 1,2-bis(diethoxysilyl)ethane, 1,1-bis(triethoxysilyl)ethane, 1,1-bis(methyldiethoxysilyl) ethane, 1,1-bis(diethoxysilyl)ethane, 1,1-dimethyl-1,1-bis(triethoxysilyl)methane, 1,1-dimethyl-1,1-bis(methyldiethoxysilyl)methane, and 1,1-dimethyl-1,1-bis(diethoxysilyl)methane.

13. The chemical vapor deposition method of claim 1 wherein the at least one organosilicon precursor is a precursor of Formula (II).

14. The chemical vapor deposition method of claim 13 wherein the at least one organosilicon precursor is at least one precursor selected from the group consisting of 1,1,3,3-tetramethoxy-1,3-disilacyclobutane, 1,3-dimethoxy-1,3-dimethyl-1,3-disilacyclobutane, 1,3-diemthoxy-1,3-disilacyclobutane, 1,3,3-trimethoxy-1-methyl-1,3-disilacyclobutane, 1,3-dimethoxy-1-methyl-disilacyclobutane, 1,1-dimethoxy-1,3-disilacyclobutane, 1,1,4,4-tetramethoxy-1,4-disilacyclohexane, 1,4-dimethoxy-1,4-dimethyl-1,4-disilacyclohexane, 1,4-diemthoxy-1,4-disilacyclohexane, 1,4,4-trimethoxy-1-methyl-1,4-disilacyclohexane, 1,4-dimethoxy-1-methyl-disilacyclohexane, 1,1-dimethoxy-1,4-disilacyclohexane,1,1,3,3-tetraethoxy-1,3-disilacyclobutane, 1,3-diethoxy-1,3-dimethyl-1,3-disilacyclobutane, 1,3-diemthoxy-1,3-disilacyclobutane, 1,3,3-triethoxy-1-methyl-1,3-disilacyclobutane, 1,3-diethoxy-1-methyl-disilacyclobutane, 1,1-diethoxy-1,3-disilacyclobutane,1,1,4,4-tetraethoxy-1,4-disilacyclohexane,1,4-diethoxy-1,4-dimethyl-1,4-disilacyclohexane, 1,4-diemthoxy-1,4-disilacyclohexane, 1,4,4-triethoxy-1-methyl-1,4-disilacyclohexane,1,4-diethoxy-1-methyl-disilacyclohexane, and 1,1-diethoxy-1,4-disilacyclohexane.

15. The chemical vapor deposition method of claim 1 wherein the at least one organosilicon precursor is free of halide ions, $Al^{3+}$ ions, $Fe^{2+}$ ions, $Fe^{3+}$ ions, $Ni^{2+}$ ions, and $Cr^{3+}$ ions.

16. The chemical vapor deposition method of claim 15 wherein the halide ions include chlorides, fluorides, bromides, and iodides.

17. The chemical vapor deposition method of claim 1 wherein the method is a plasma enhanced chemical vapor deposition method.

18. The chemical vapor deposition method of claim 1 wherein the method is a thermal chemical vapor deposition method.

19. The chemical vapor deposition method of claim 1 wherein the substrate is a silicon wafer.

20. The chemical vapor deposition method of claim 1 wherein the film has one or more bond types selected from the group consisting of Si—O—C, Si—O—Si, Si—C, Si—F, Si—H, C—O, C—H, and C—F.

21. The chemical vapor deposition method of claim 1 wherein the one or more reactive substances are selected from the group consisting of a gaseous or liquid organic substance, ammonia, hydrogen, carbon dioxide, carbon monoxide, a fluorocarbon, and mixtures thereof.

22. A film formed by the method of claim 1.

23. The film of claim 22 wherein said film has a density of 1.8 g/cc or greater.

24. The film of claim 23 wherein said film has a density of 2.0 or greater.

25. The film of claim 24 wherein said film has a dielectric constant of 2.5 to 3.5 and a Young's modulus greater than 20 GPa and/or a nanoindentation hardness greater than 3.5 GPa.

* * * * *

UNITED STATES PATENT AND TRADEMARK OFFICE
CERTIFICATE OF CORRECTION

PATENT NO. : 10,249,489 B2
APPLICATION NO. : 15/789790
DATED : April 2, 2019
INVENTOR(S) : Raymond Nicholas Vrtis et al.

It is certified that error appears in the above-identified patent and that said Letters Patent is hereby corrected as shown below:

In the Specification

In Column 6, Line 67 to Column 7, Line 1:
Delete "1,1-bis(trimethoxysilyl)ethane" and insert -- 1,1-bis(trimethoxysilyl)methane --

In Column 7, Lines 1-2:
Delete "1,1-bis(methyldimethoxysilyl)ethane" and insert -- 1,1-bis(methyldimethoxysilyl)methane --

In Column 7, Line 2:
Delete "1,1-bis(dimethoxysilyl)ethane" and insert -- 1,1-bis(dimethoxysilyl)methane --

In Column 7, Lines 7-8:
Delete "1,1-bis(triethoxysilyl)ethane" and insert -- 1,1-bis(triethoxysilyl)methane --

In Column 7, Lines 8-9:
Delete "1,1-bis(methyldiethoxysilyl)ethane" and insert -- 1,1-bis(methyldiethoxysilyl)methane --

In Column 7, Line 9:
Delete "1,1-bis(diethoxysilyl)ethane" and insert -- 1,1-bis(diethoxysilyl)methane --

In Column 12, Line 13:
Delete "1,2-bis(dimethoxymethylsilyl)methane" and insert
-- 1,1-bis(dimethoxymethylsilyl)methane --

In Column 12, Line 27:
Delete "PMOM-DSP" and insert -- PMOM-DSB --

Signed and Sealed this
Fifth Day of December, 2023

Katherine Kelly Vidal
*Director of the United States Patent and Trademark Office*

CERTIFICATE OF CORRECTION (continued)
U.S. Pat. No. 10,249,489 B2

In Column 12, Lines 30-31:
Delete "1,1,1,3,3-pentamethoxy-3-methyl-1,3,disilapentane (PMOM-DSP)" and insert
-- 1,1,1,3,3-pentamethoxy-2-methyl-1,3-disilabutane (PMOM-DSB) --